US009059093B2

(12) United States Patent
Tarabbia et al.

(10) Patent No.: US 9,059,093 B2
(45) Date of Patent: Jun. 16, 2015

(54) FORMING FINFET CELL WITH FIN TIP AND RESULTING DEVICE

(71) Applicant: GLOBALFOUNDRIES Inc., Grand Cayman (KY)

(72) Inventors: Marc Tarabbia, Austin, TX (US); Anurag Mittal, Saratoga Springs, NY (US); Nader Hindawy, Wappingers Falls, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 28 days.

(21) Appl. No.: 14/081,736

(22) Filed: Nov. 15, 2013

(65) Prior Publication Data

US 2015/0137203 A1 May 21, 2015

(51) Int. Cl.
*H01L 21/30* (2006.01)
*H01L 21/28* (2006.01)
*H01L 29/78* (2006.01)
*H01L 29/66* (2006.01)

(52) U.S. Cl.
CPC ...... *H01L 21/28158* (2013.01); *H01L 29/7856* (2013.01); *H01L 29/66795* (2013.01)

(58) Field of Classification Search
CPC .............. H01L 29/0673; H01L 29/66795; H01L 29/785; H01L 21/845; H01L 27/0207; H01L 27/0886; H01L 27/1211
USPC .......................................... 257/401; 498/700
See application file for complete search history.

(56) References Cited

U.S. PATENT DOCUMENTS

| 7,465,998 B2* | 12/2008 | Ono .............................. 257/401 |
| 2011/0115024 A1* | 5/2011 | Lee et al. ....................... 257/368 |
| 2013/0052793 A1* | 2/2013 | Shieh et al. ................... 438/401 |
| 2013/0210232 A1* | 8/2013 | De et al. ........................ 438/700 |

OTHER PUBLICATIONS

Kulkarni et al., "A 32nm High-k and Metal-Gate Anti-Fuse Array Featuring a 1.01um 1T1C Bit Cell," Logic Technology Development, Intel Corporation, Hillsboro, OR, USA, IEEE Symposium on VLSI Technology Digest of Technical Papers, pp. 79-80, 2012.
Peng et al., "A Novel Embedded OTP NVM Using Standard Foundry CMOS Logic Technology," IEEE NVSMW, pp. 24-26, 2006.
Wee et al., "Antifuse Circuits and Their Applications to Post-Package of DRAMs," Journal of Semiconductor Technology and Science, vol. 1, No. 4, Dec. 2001, pp. 216-231.
www.kilopass.com/about/partners/foundry-partners/, Kilopass Technology, retrieved Dec. 17, 2013.

* cited by examiner

*Primary Examiner* — Matthew W Such
*Assistant Examiner* — David Spalla
(74) *Attorney, Agent, or Firm* — Ditthavong & Steiner, P.C.

(57) ABSTRACT

Methods for forming a variable fin FinFET cell wherein a plurality of fins is formed above a substrate, a portion of a fin is removed, forming a fin tip, a first area of a gate oxide layer is formed above the fin tip, and a second area of the gate oxide layer is formed above at least a remaining portion of the plurality of fins, wherein the first area is thicker than the second area.

20 Claims, 9 Drawing Sheets

FORMING FINFET CELL WITH FIN TIP AND RESULTING DEVICE

TECHNICAL FIELD

The present disclosure relates to forming fin field-effect transistor (FinFET) cells with a variable number of active fins, and the resulting devices, and is particularly applicable to 20 nanometer (nm) technology nodes and beyond.

BACKGROUND

Having a variable number of active fins in a standard FinFET cell allows for a good tradeoff between high performance and low power. A FinFET cell with a variable number of active fins may have two fins at an input and four fins at an output. Forming a FinFET cell with a variable number of fins requires cutting fins under active gates to control the fin source/drain topology. To reduce manufacturing time and expense, a single cut mask may be used to form the variable number of fins within the FinFET cell. However, the single cut mask may create a sharp angled end of a fin, also known as a fin tip. Because of electrical field effects at the fin tip, the fin tip may cause a breakdown in the gate oxide of a corresponding gate.

A need, therefore, exists for a method that reduces the gate oxide breakdown caused by a fin tip, and the resulting device that does not suffer from gate oxide breakdown.

SUMMARY

An aspect of the present disclosure is a method for forming a variable fin FinFET cell with improved resistance to gate oxide breakdown at a fin tip.

Another aspect of the present disclosure is a variable fin FinFET cell with improved resistance to gate oxide breakdown at a fin tip.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a plurality of fins above a substrate, removing a portion of a fin, forming a fin tip, forming a first area of a gate oxide layer above the fin tip, and forming a second area of the gate oxide layer above at least a remaining portion of the plurality of fins, wherein the first area is thicker than the second area.

An aspect of the present disclosure includes forming the first area to a thickness of 30 to 70 Angstroms (Å). A further aspect includes forming the second area to a thickness of 10 to 15 Å. An additional aspect includes removing the portion of the fin using a single mask. Yet another aspect includes the single mask being a corner rounding cut mask. Another aspect includes forming a gate above the fin tip. A further aspect includes forming the gate over the first area of the gate oxide layer above the fin tip. Still another aspect includes forming the first area of the gate oxide layer of a high-k dielectric and a non-high-k dielectric. A further aspect includes forming the second area of the gate oxide layer of the high-k dielectric.

Another aspect of the present disclosure is a device including: a substrate, a plurality of fins above the substrate, at least one fin including a fin tip, a gate oxide layer, the gate oxide layer including a first area above the fin tip and a second area above at least a remaining portion of the plurality of fins, wherein the first area is thicker than the second area.

Aspects include the first area having a thickness of 30 to 70 Å. Another aspect includes the second area having a thickness of 10 to 15 Å. An additional aspect includes the fin tip constituting an oblique-angled end of the fin. Yet another aspect includes the fin tip formed based on a corner rounding cut mask. Still another aspect includes a gate above the fin tip. A further aspect includes the gate formed over the first area of the gate oxide layer above the fin tip. An additional aspect includes the first area of the gate oxide layer formed of a high-k dielectric and a non-high-k dielectric. A further aspect includes the second area of the gate oxide layer formed of the high-k dielectric.

Another aspect of the present disclosure is a method including forming a plurality of fins above a substrate, removing a portion of a fin, forming a fin tip, forming a first oxide layer over a first area and a second area, the first area covering the fin tip and the second area covering the substrate and remaining fins of the plurality of fins, forming a mask over the first area, removing the first oxide layer in the second area, and forming a second oxide layer over the first area and the second area.

A further aspect of the method includes forming a plurality of gates over the substrate and the plurality of fins, at least one gate formed over the fin tip, with the first oxide layer formed of at least one of silicon dioxide ($SiO_2$) and silicon oxynitride ($SiO_2N$), and the second oxide layer formed of a high-k dielectric.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of gate oxide breakdown attendant upon defining variable fin FinFET cells using a single mask. In accordance with embodiments of the present disclosure, a thicker portion of a gate oxide layer is used at the fin tip to reduce the gate oxide breakdown.

Methodology in accordance with an embodiment of the present disclosure includes forming a plurality of fins above a substrate. A portion of a fin is then removed to form the variable number of fins, forming a fin tip. Next, a first area of a gate oxide layer is formed above the fin tip. Subsequently, a second area of the gate oxide layer is formed above at least a remaining portion of the plurality of fins, with the first area being thicker than the second area. The thicker area of the gate oxide layer at the fin tip reduces the vertical electrical field resulting from the fin tip, which reduces a breakdown in the gate oxide layer and improves reliability of the gate.

Figure 1:
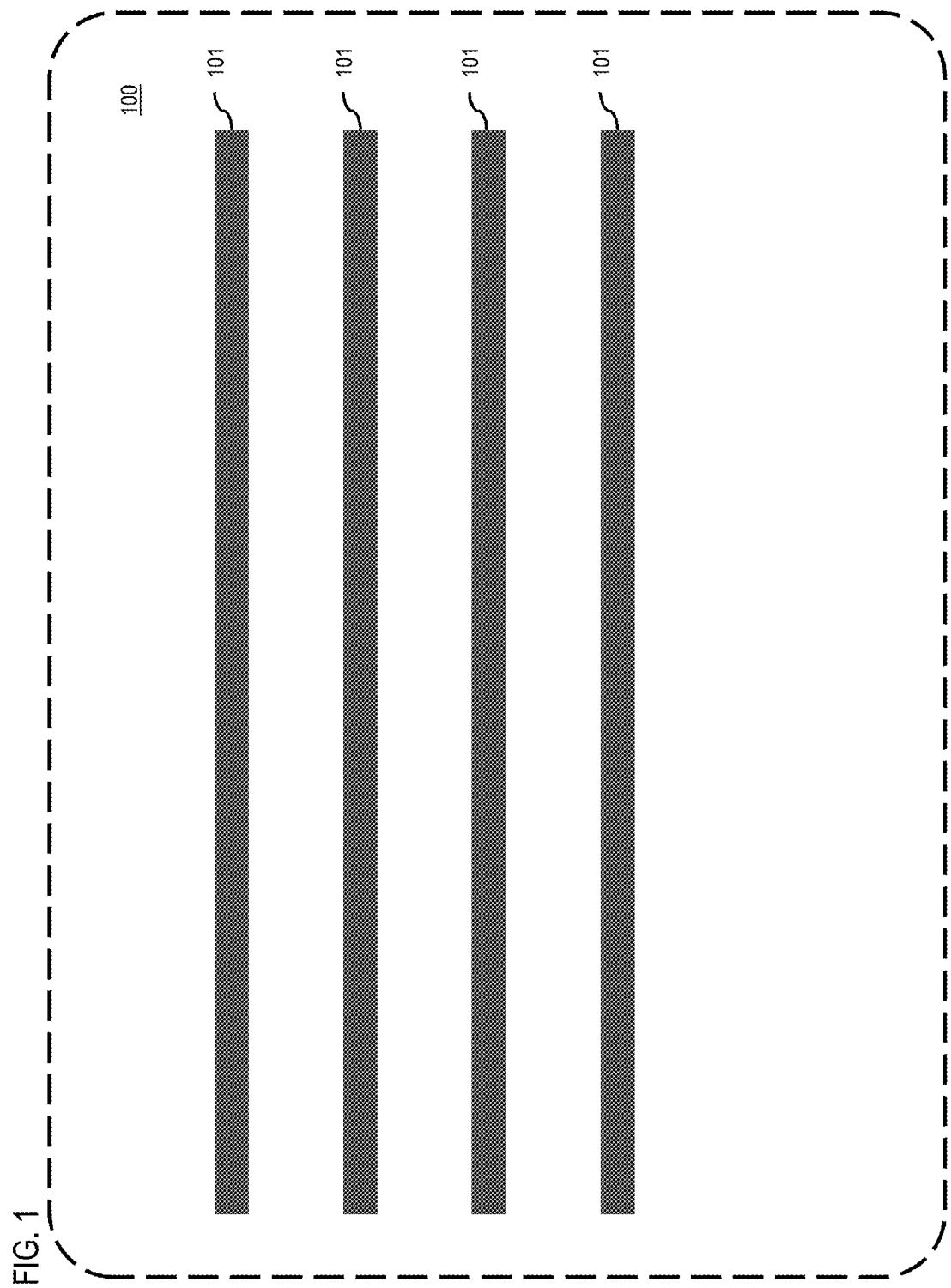
FIGS. 1 through 9 schematically illustrate a method for forming a variable fin FinFET cell, including a fin tip, with improved resistance to gate oxide breakdown, in accordance with an exemplary embodiment.

Adverting to FIG. 1, a method for forming a variable fin FinFET cell, according to an exemplary embodiment, begins with a substrate 100. The substrate can be any type of semiconductor substrate, such as silicon (Si), silicon germanium (SiGe), etc. Fins 101 are formed on the substrate 100 for forming the FinFETs. The fins 101 can be formed according to any conventional processing.

Figure 2:
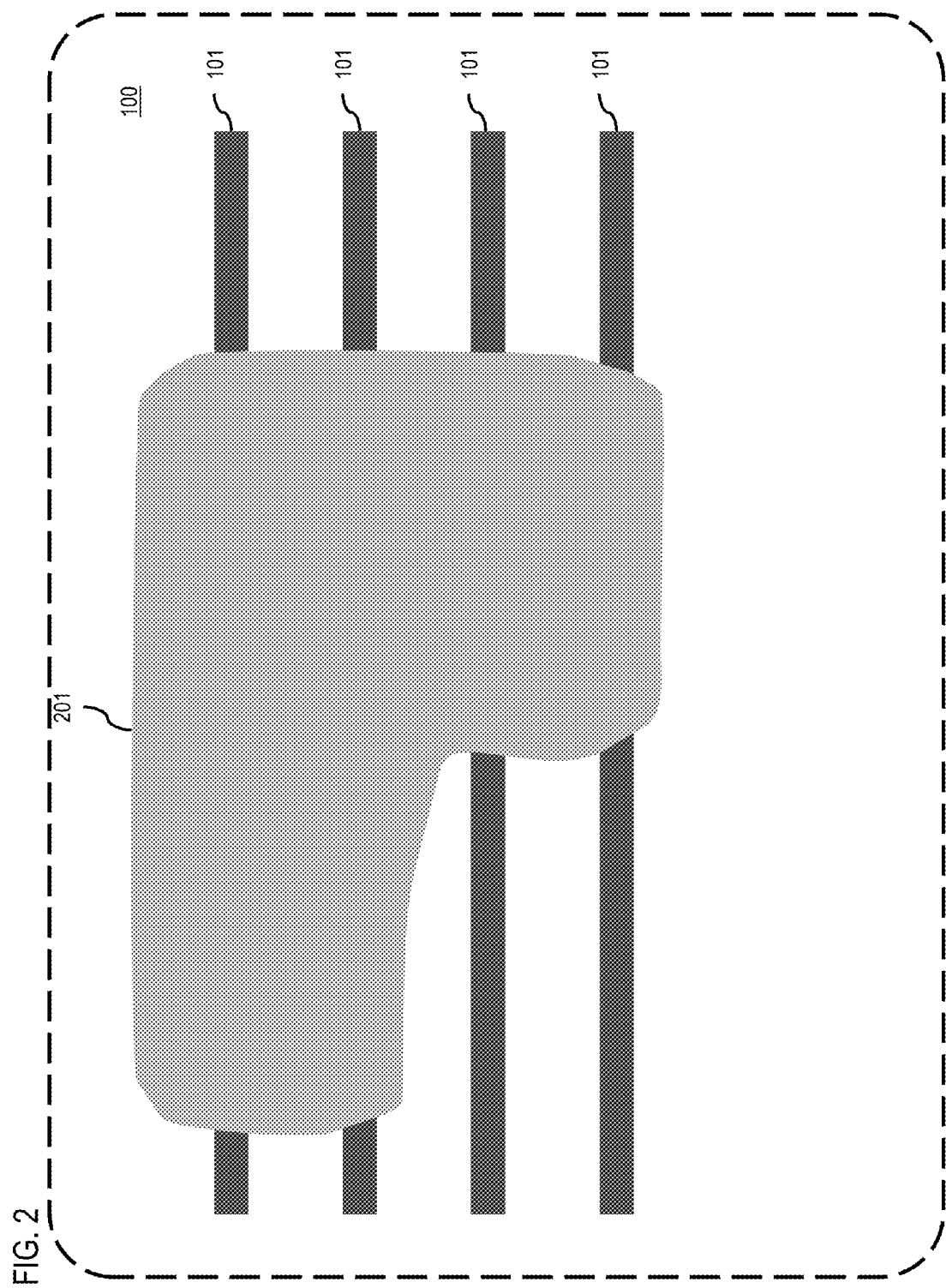

Next, a mask 201 is formed over the substrate 100, partially covering the fins 101, as illustrated in FIG. 2. The mask 201 may be a single cut mask, such as a corner rounding cut mask. The mask 201 may be formed of any material that acts as a mask.

Figure 3:
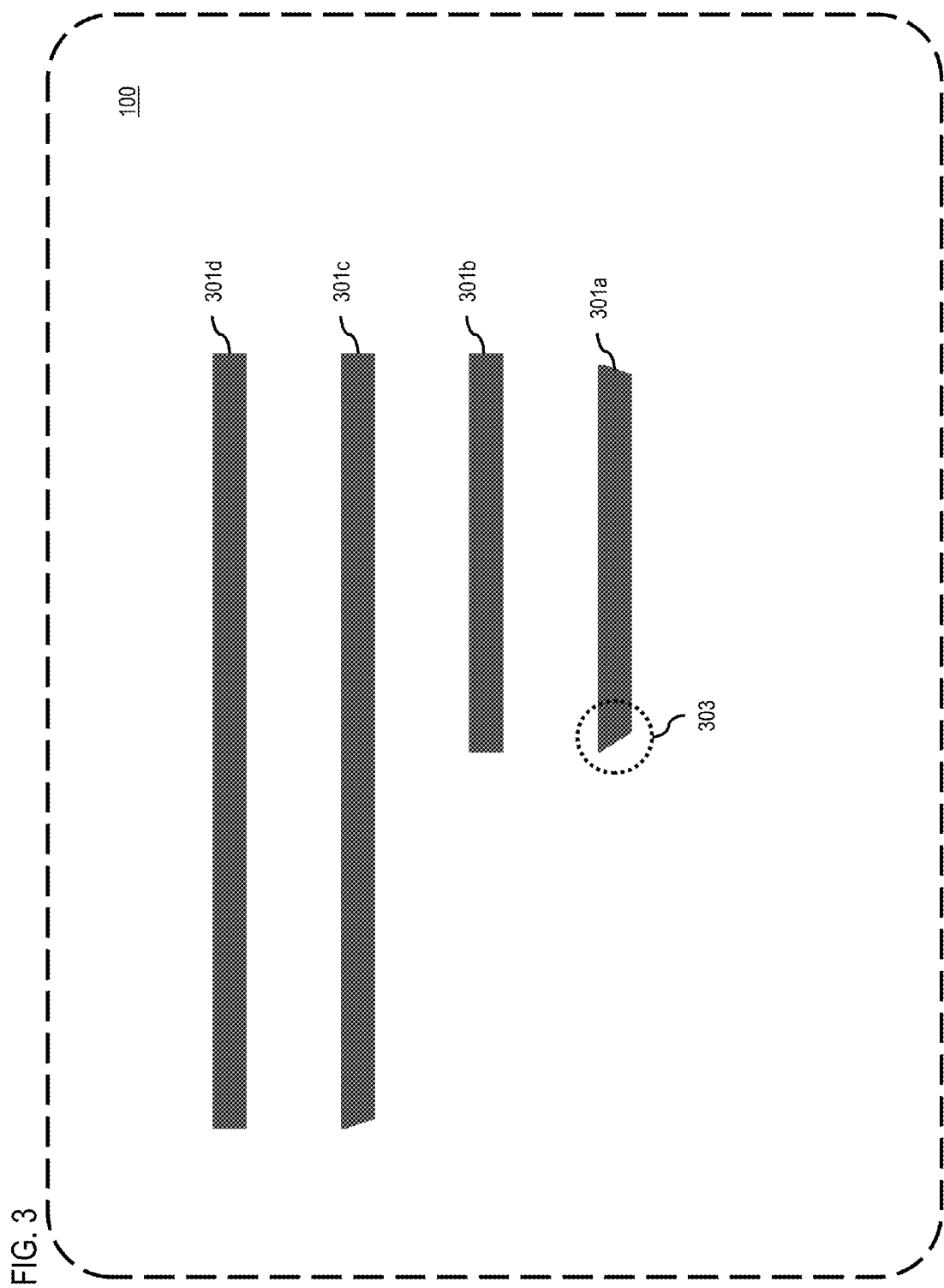

Adverting to FIG. 3, the fins 101 are removed where exposed by the mask 201, and the mask 201 is subsequently removed, forming partial fins 301a through 301d. Although the mask 201 is described as a single mask, more than one mask may be used to form the partial fins 301a-301d. However, as discussed below, the current method allows for use of a single mask. Depending on the geometry of the mask 201, partial fins 301 may be formed that include oblique-angled ends, or fin tips, such as the fin tip 303 for the partial fin 301a. Because of the shape of the fin tip 303, the fin tip 303 may experience a localized higher vertical electrical field when voltage is applied between a gate and the substrate 100.

Figure 4:
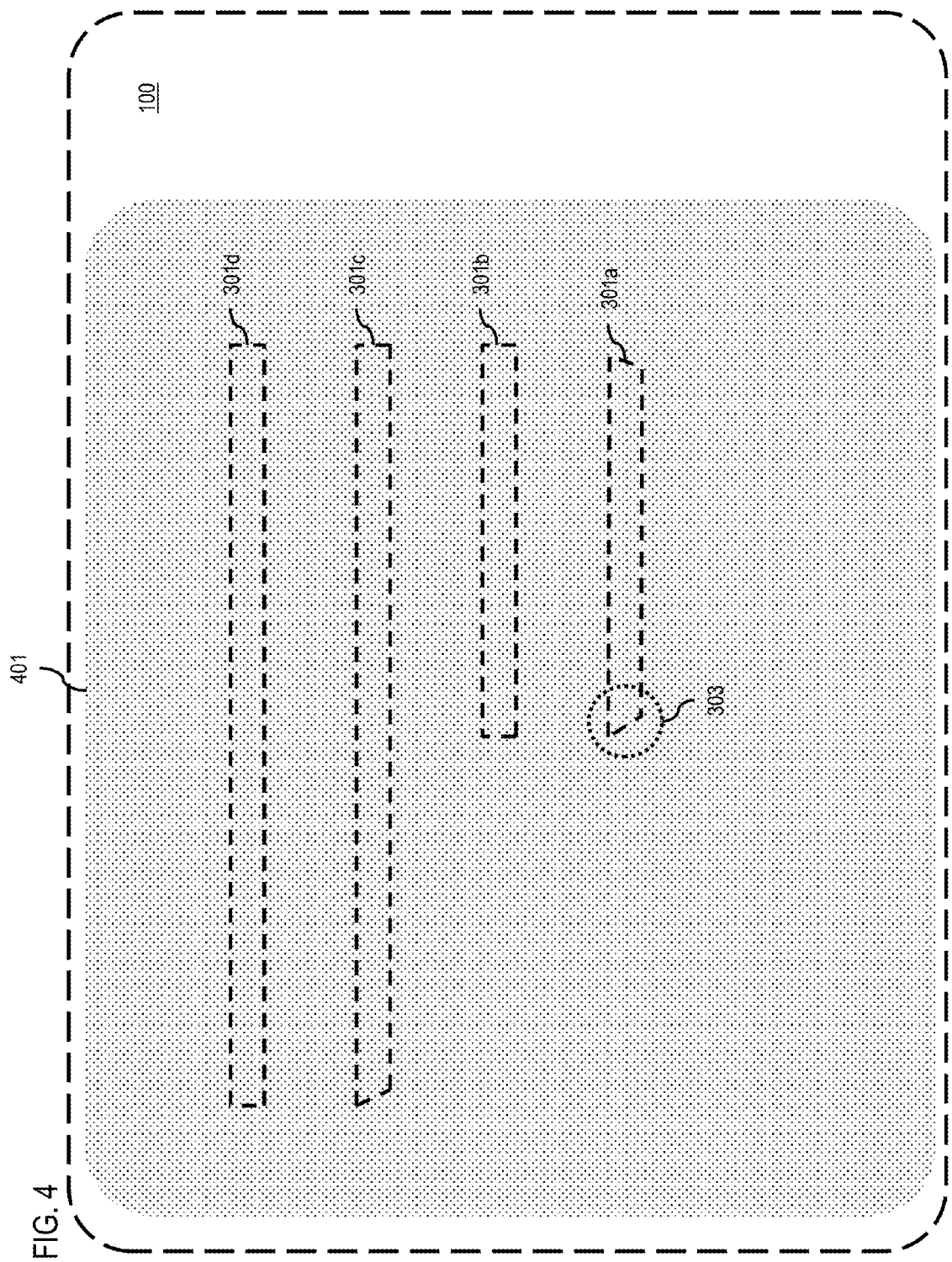

Next, a gate oxide layer 401 is formed over the substrate 100 and the partial fins 301a-301d, as illustrated in FIG. 4. The gate oxide layer 401 may be formed to a thickness of 20 to 55 Å and may be formed of one or more non-high k dielectrics, such as $SiO_2$ or $SiO_2N$. The breakdown voltage of the gate oxide layer 401 may be 1.8 to 2.5 volts (V).

Figure 5:
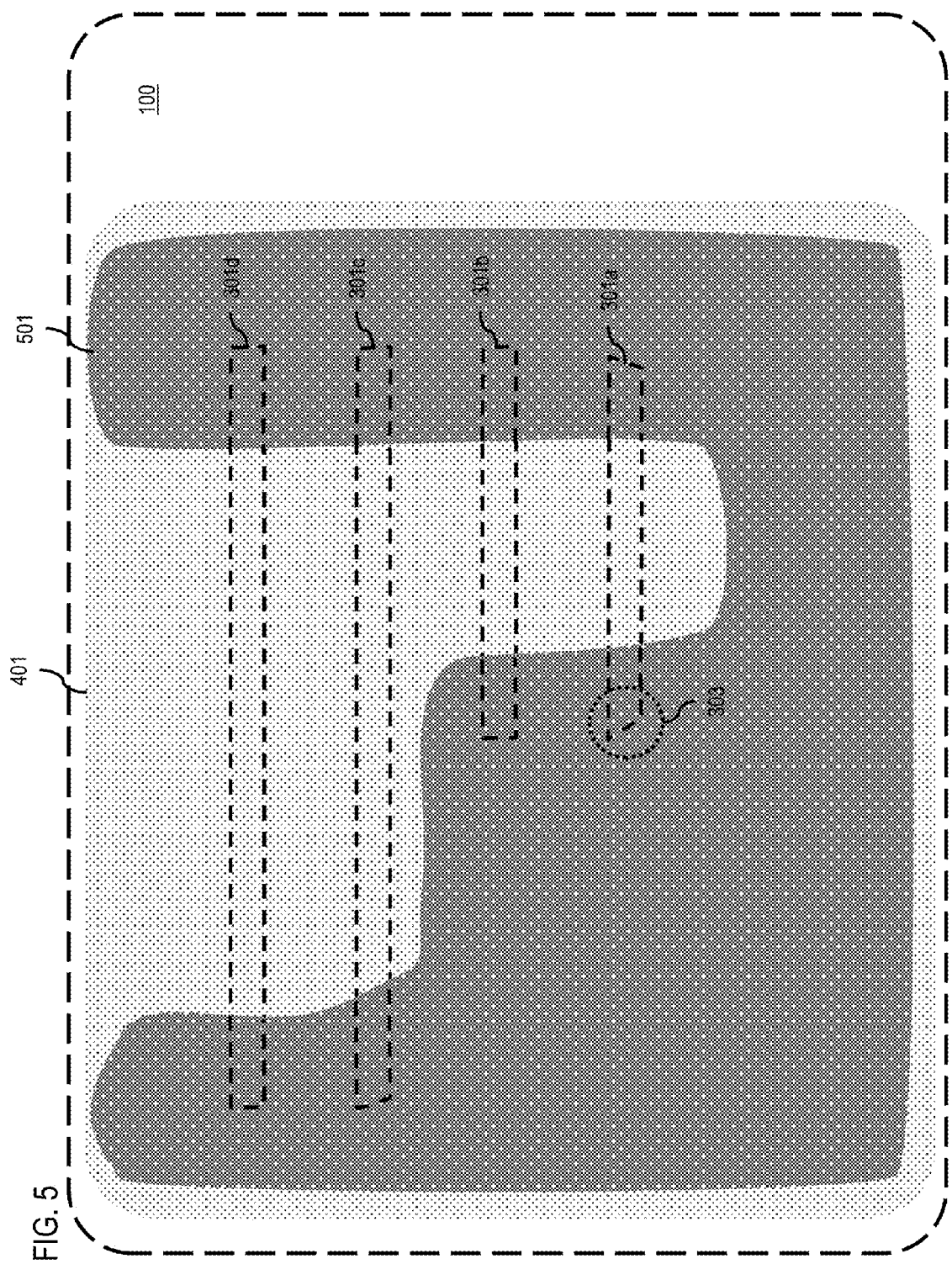
Figure 6:
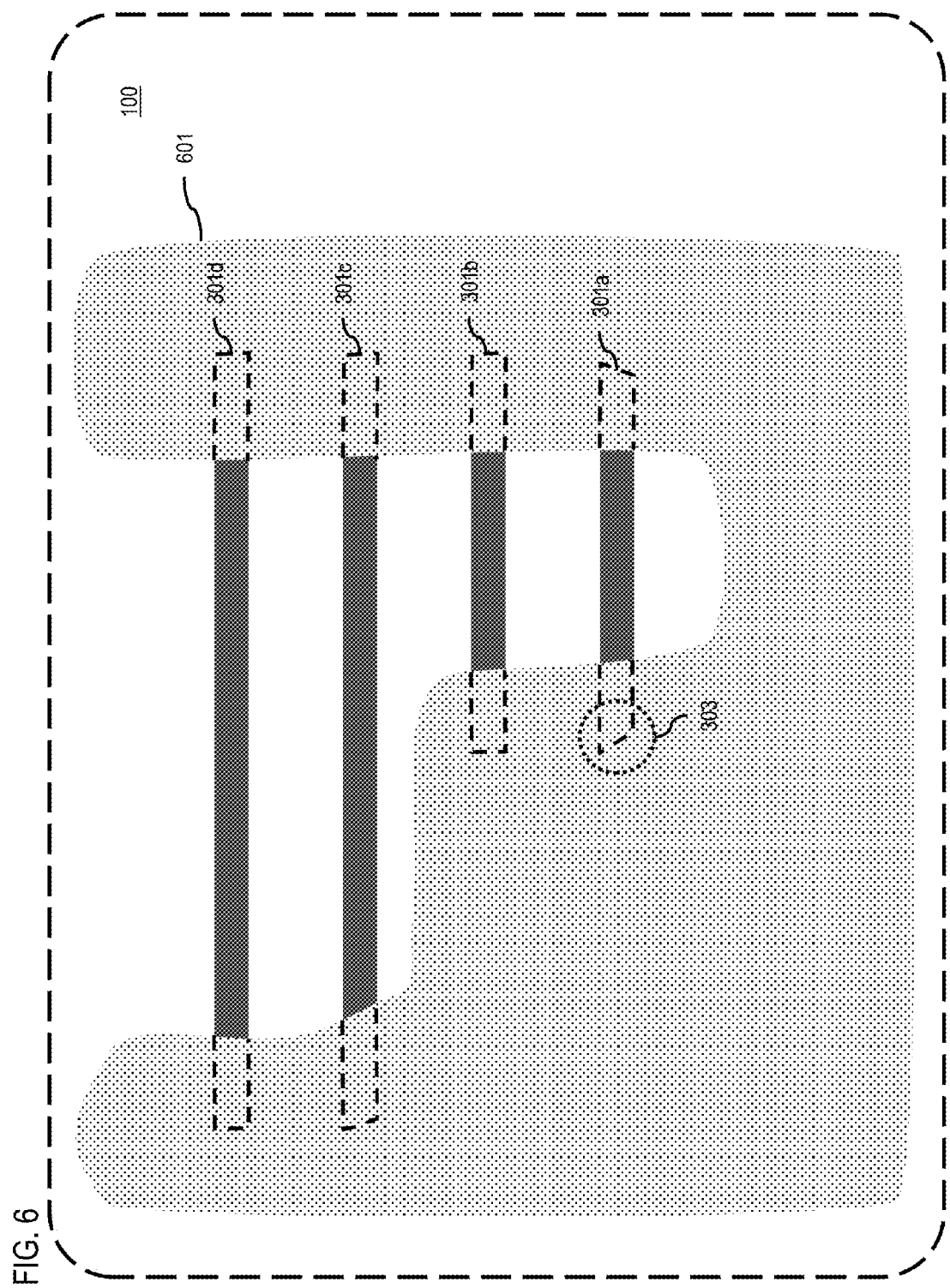

After forming the gate oxide layer 401, a mask 501 is formed over the gate oxide layer 401, as illustrated in FIG. 5. The mask 501 is formed to expose part of the partial fins 301a-301d and cover the ends of the partial fins 301a-301d and the fin tip 303. The mask 501 prevents the covered part of the gate oxide layer 401 from being removed. Thus, the exposed portion of the gate oxide layer 401 is removed (and subsequently the mask 501) to form a partial gate oxide layer 601, as illustrated in FIG. 6.

Figure 7:
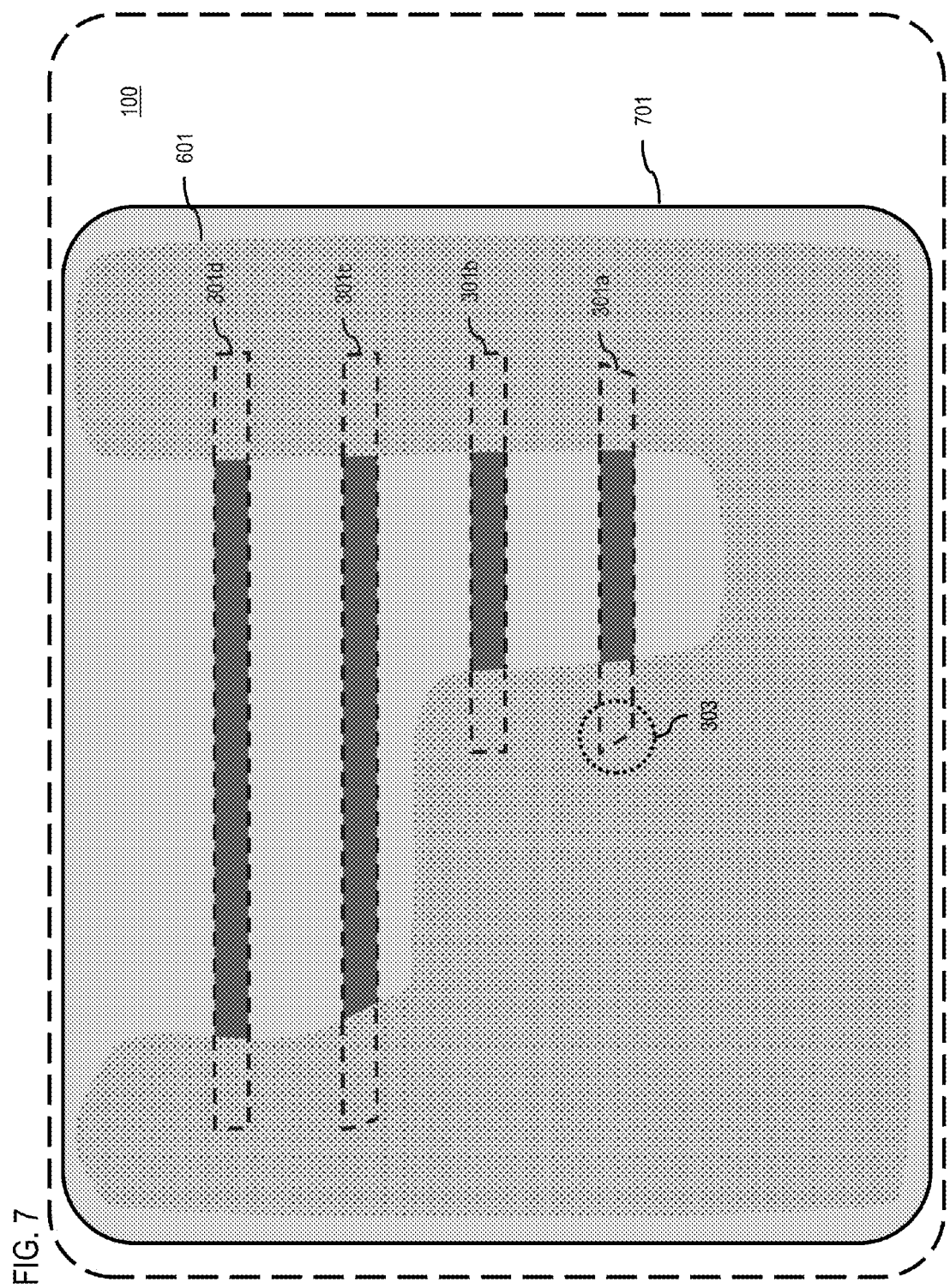

Adverting to FIG. 7, another gate oxide layer 701 is formed over the substrate 100, the partial gate oxide layer 601, and the exposed parts of the partial fins 301a-301d. The gate oxide layer 701 may be formed to a thickness of 10 to 15 Å and may be formed of a high-k dielectric, such that the gate oxide layer 701 has an equivalent oxide thickness of 10 to 20 Å.

Figure 8:
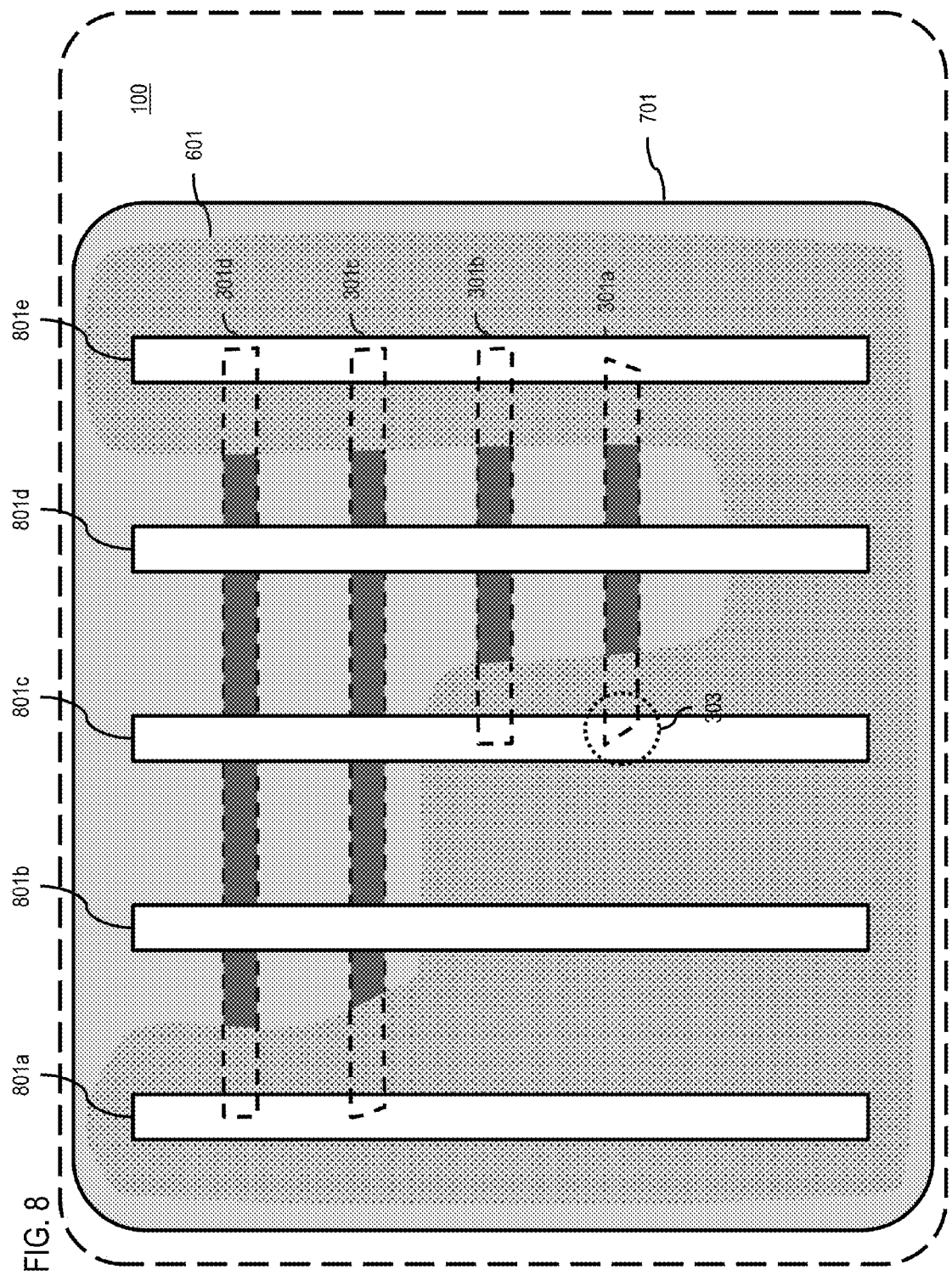

After forming the gate oxide layer 701, gates 801a-801e are formed over the gate oxide layer 701, with gate 801c formed over the fin tip 303, as illustrated in FIG. 8. While conventional logic gates may be formed to a width of 10 to 40 nm, gate 801c over the fin tip 303 may be formed to a width of 70 to 150 nm so that the gate 801c covers the entire fin tip 303.

Figure 9:
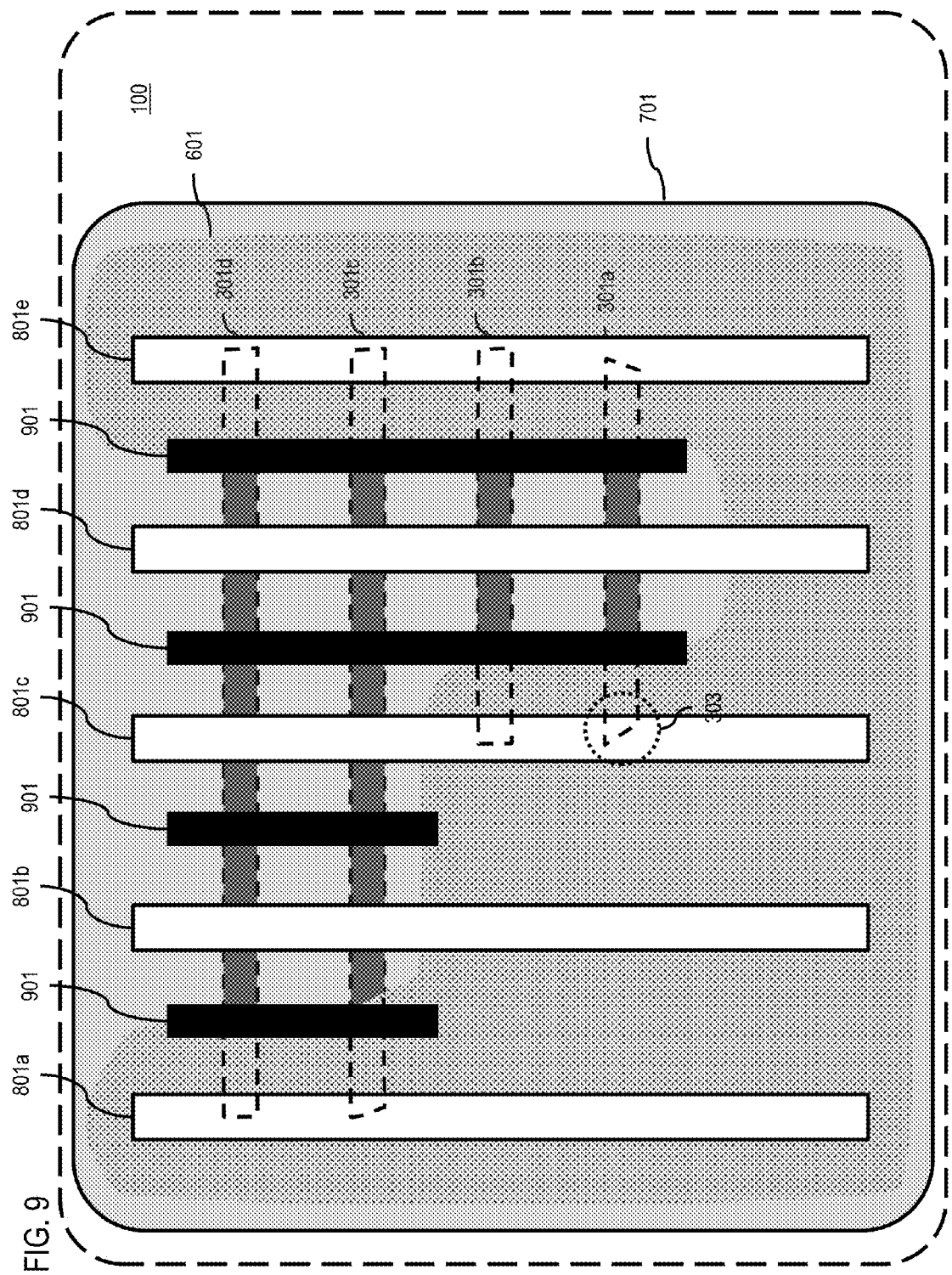

After forming the gates 801a-801e, contacts 901 for sources and drains are formed between the gates 801a-801e extending across the partial fins 301a-301d, as illustrated in FIG. 9. By forming the partial gate oxide layer 601 over the fin tip 303, the thickness of the partial gate oxide layer 601, alone, and in combination with the gate oxide layer 701 reduces the effects of the increased vertical electrical field caused by the shape of the fin tip 303, such as reducing the effects as much as 2 to 4 four times as compared to conventional gate oxide layers at the fin tip. The increase in thickness of the gate oxide further reduces the parasitic coupling between the gate (e.g., gate 801c) and the fin tip 303. According to the foregoing, less costly manufacturing processes may be used to form the partial fins 301a-301d, such as the corner rounding cut mask described above, while reducing the negative effects on the resulting device caused by the fin tip 303 being cut at an oblique angle.

The embodiments of the present disclosure achieve several technical effects, including forming a variable fin FinFET cell using a single cut mask that does not suffer from gate oxide breakdown at a fin tip. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras, particularly for 20 nm technologies and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a plurality of fins above a substrate;
   removing a portion of a fin, forming a fin tip;
   forming a first area of a gate oxide layer above the fin tip; and
   forming a second area of the gate oxide layer above at least a remaining portion of the plurality of fins,
   wherein the first area is thicker than the second area.

2. The method according to claim 1, comprising:
   forming the first area to a thickness of 30 to 70 Angstroms (Å).

3. The method according to claim 1, comprising:
   forming the second area to a thickness of 10 to 15 Å.

4. The method of claim 1, comprising:
   removing the portion of the fin using a single mask.

5. The method according to claim 4, wherein the single mask is a corner rounding cut mask.

6. The method according to claim 1, further comprising:
   forming a gate above the fin tip.

7. The method according to claim 6, comprising:
   forming the gate over the first area of the gate oxide layer above the fin tip.

8. The method according to claim 1, comprising:
forming the first area of the gate oxide layer of a high-k dielectric and a non-high-k dielectric.

9. The method according to claim 8, comprising:
forming the second area of the gate oxide layer of the high-k dielectric.

10. An apparatus comprising:
a substrate;
a plurality of fins above the substrate, at least one fin including a fin tip;
a gate oxide layer, the gate oxide layer including a first area above the fin tip and a second area above at least a remaining portion of the plurality of fins,
wherein the first area is thicker than the second area.

11. The apparatus according to claim 10, comprising:
the first area having a thickness of 30 to 70 Angstroms (Å).

12. The apparatus according to claim 10, comprising:
the second area having a thickness of 10 to 15 Å.

13. The apparatus according to claim 10, wherein:
the fin tip comprises an oblique-angled end of the fin.

14. The apparatus according to claim 13, comprising:
the fin tip formed based on a corner rounding cut mask.

15. The apparatus according to claim 10, further comprising:
a gate above the fin tip.

16. The apparatus according to claim 15, comprising:
the gate formed over the first area of the gate oxide layer above the fin tip.

17. The apparatus according to claim 10, comprising:
the first area of the gate oxide layer formed of a high-k dielectric and a non-high-k dielectric.

18. The apparatus according to claim 17, comprising:
the second area of the gate oxide layer formed of the high-k dielectric.

19. A method comprising:
forming a plurality of fins above a substrate;
removing a portion of a fin, forming a fin tip;
forming a first oxide layer over a first area and a second area, the first area covering the fin tip and the second area covering the substrate and remaining fins of the plurality of fins;
forming a mask over the first area;
removing the first oxide layer in the second area; and
forming a second oxide layer over the first area and the second area.

20. The method according to claim 19, further comprising:
forming a plurality of gates over the substrate and the plurality of fins, at least one gate formed over the fin tip,
wherein the first oxide layer is formed of at least one of silicon dioxide ($SiO_2$) and silicon oxynitride ($SiO_2N$), and the second oxide layer is formed of a high-k dielectric.

* * * * *